United States Patent
Jonczyk et al.

(10) Patent No.: US 8,334,194 B2
(45) Date of Patent: Dec. 18, 2012

(54) METHODS AND APPARATUS FOR MANUFACTURING SEMICONDUCTOR WAFERS

(75) Inventors: Ralf Jonczyk, Wilmington, DE (US); James Rand, Landenberg, PA (US)

(73) Assignee: Motech Americas, LLC, Newark, DE (US)

( * ) Notice: Subject to any disclaimer, the term of this patent is extended or adjusted under 35 U.S.C. 154(b) by 735 days.

(21) Appl. No.: 12/026,586

(22) Filed: Feb. 6, 2008

(65) Prior Publication Data

US 2009/0194849 A1    Aug. 6, 2009

(51) Int. Cl.
*H01L 21/324* (2006.01)
(52) U.S. Cl. .......... 438/486; 438/799; 257/E21.09
(58) Field of Classification Search .......... 438/486, 438/488, 795, 799; 257/E21.09
See application file for complete search history.

(56) References Cited

U.S. PATENT DOCUMENTS

| | | | |
|---|---|---|---|
| 4,050,507 A | 9/1977 | Chu et al. | |
| 4,330,363 A | 5/1982 | Biegesen et al. | |
| 4,389,904 A | 6/1983 | Lacy et al. | |
| 4,693,759 A | 9/1987 | Noguchi et al. | |
| 5,893,948 A | 4/1999 | Nickel et al. | |
| 6,113,689 A | 9/2000 | Moon | |
| 6,316,338 B1 | 11/2001 | Jung | |
| 6,451,631 B1 | 9/2002 | Grigoropoulos et al. | |
| 6,555,449 B1 | 4/2003 | Im et al. | |
| 6,635,932 B2 | 10/2003 | Grigoropoulos et al. | |
| 2005/0176218 A1* | 8/2005 | Jonczyk et al. | 438/478 |
| 2006/0289433 A1* | 12/2006 | Timans | 219/390 |

FOREIGN PATENT DOCUMENTS

| | | |
|---|---|---|
| EP | 0591949 | 4/1994 |
| EP | 0591949 A1 | 4/1994 |
| WO | 2004012257 | 2/2004 |
| WO | 2004012257 A1 | 2/2004 |

OTHER PUBLICATIONS

European Search Report, EP09151743, dated Jun. 8, 2009, pp. 9.
Hahn et al., New Crystalline Silicon Ribbon Materials for Photovoltaics, Journal of Physics, dated Dec. 22, 2004, pp. R1615-R1648, vol. 16, No. 50.
Hahn, G., et al. "New crystalline silicon ribbon materials for photovoltaics", Institute of Physics Publishing, Journal of Physics, Condensed Matter, vol. 16, No. 50, Dec. 22, 2004, pp. R1615-R1648.
European Search Report dated May 15, 2009.
Office Action issued Apr. 1, 2010 in 09151743.3 (EP).

* cited by examiner

*Primary Examiner* — Wensing Kuo
(74) *Attorney, Agent, or Firm* — Saul Ewing LLP

(57) ABSTRACT

Methods and apparatus for fabricating a semiconductor sheet are provided. In one aspect, a method for fabricating a semiconductor wafer includes applying a layer of semiconductor material across a portion of a setter material, introducing the setter material and the semiconductor material to a predetermined thermal gradient to form a melt, wherein the thermal gradient includes a predetermined nucleation and growth region, and forming at least one local cold spot in the nucleation and growth region to facilitate inducing crystal nucleation at the at least one desired location.

14 Claims, 4 Drawing Sheets

METHODS AND APPARATUS FOR MANUFACTURING SEMICONDUCTOR WAFERS

BACKGROUND OF THE INVENTION

This invention relates generally to semiconductor sheets, and more specifically to methods and apparatus for manufacturing semiconductor wafers.

Wafers formed of semiconductor materials are used in a variety of applications and most, if not all, such applications require an increasing number of such wafers. For example, the use of photovoltaic systems has become more common and of greater importance in the production of energy. Moreover, the use of photovoltaic systems is therefore expected to increase dramatically. At least some known photovoltaic systems use a semiconductor substrate, such as a substrate consisting of single crystal or poly-crystalline silicon. However, the use of photovoltaic technology may be limited by the cost of semiconductor wafers used in the photovoltaic systems.

A wide variety of fabrication methods exist for producing semiconductor wafers. In at least one known fabrication method, poly-crystalline silicon wafers for use in solar cells are produced by melting a high-purity material in an inert atmosphere. In such a method, the resulting silicon melt is cooled to form a polycrystalline ingot which is then sliced with a wire saw or an inner diameter blade to produce wafers of a desired thickness and size.

Other known fabrication methods of producing wafers rely on a random nucleation of crystals in the semiconductor material melt. Such methods generally produce low-cost wafers, but because control of the nucleation of the semiconductor material melt is difficult, such wafers are generally of a low quality. Use of low-quality wafers within photovoltaic cells generally lowers the efficiency of such cells. Moreover, because the control of the nucleation of the semiconductor material is difficult, the costs of manufacturing such wafers is generally higher than with other fabrication methods.

BRIEF DESCRIPTION OF THE INVENTION

In one aspect, a method for fabricating a semiconductor wafer is provided. The method includes applying a layer of semiconductor material across a portion of a setter material, introducing the setter material and the semiconductor material to a predetermined thermal gradient to form a melt, wherein the thermal gradient includes a predetermined nucleation and growth region, and forming at least one local cold spot in the nucleation and growth region to facilitate inducing crystal nucleation at the at least one desired location.

In another aspect, a method for fabricating a wafer is provided. The method includes providing a setter, applying a release coating across a top surface of the setter, depositing a semiconductor material across a top surface of the release coating, forming a melt by introducing the release coating and the semiconductor material to a predetermined temperature gradient, and applying a thermal pattern to the melt to induce nucleation in at least one desired location.

In another aspect, a semiconductor wafer is provided. The wafer includes a body having a substantially uniform crystallization defined by a predetermined pattern. The wafer is fabricated by applying a release coating across a top surface of a setter material, applying at least one layer of at least one semiconductor material across a top surface of the release coating, introducing the setter material, release coating, and the at least one semiconductor material to a predetermined temperature gradient to form a melt across the at least one semiconductor material layer, and forming at least one local cold spot according to the predetermined pattern.

DETAILED DESCRIPTION OF THE INVENTION

Currently, silicon is one of the most commonly used semiconductor materials, also referred to as feedstock, used in the fabrication of semiconductor wafers. Accordingly, as used herein, the terms "semiconductor" and "semiconductor materials" refer to silicon based components and silicon materials. However, as will be readily appreciated by one of ordinary skill in the art, other semiconductor materials in addition to the silicon materials and/or including non-silicon materials can be fabricated using the apparatus and methods described herein. Although only the use of silicon powder feedstock is described herein for use in fabricating a silicon sheet, liquid silicon feedstock and/or crystallized silicon feedstock may be used without deviating from the present invention.

Figure 1:
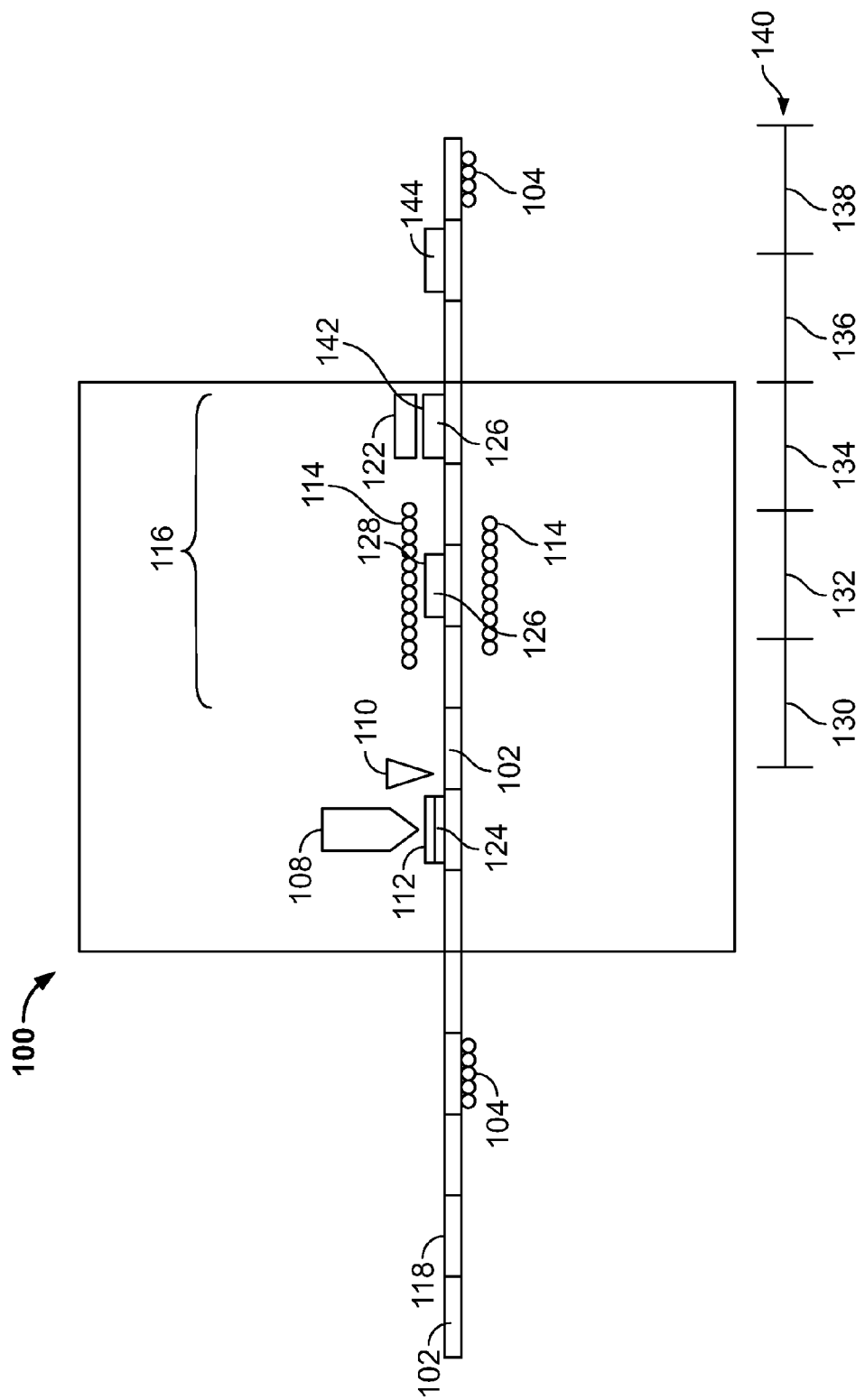
FIG. 1 is a schematic diagram of an exemplary fabrication apparatus that may be used to manufacture semiconductor wafers.

FIG. 1 is a schematic diagram of an exemplary fabrication apparatus 100 that may be used to manufacture semiconductor wafers. In the exemplary embodiment, fabrication apparatus 100 is a controlled atmosphere furnace that includes a plurality of zones able to operate with different temperature conditions. Fabrication apparatus 100, in the exemplary embodiment, includes a plurality of rollers 104, a hopper 108, a doctor blade 110, and a heating/cooling region 116. Moreover, in the exemplary embodiment, setter 102 is propelled by rollers 104 to enable setter 102 to be moved under a hopper 108 that deposits a desired quantity of semiconductor material 112, and any desired additives, across a portion of a top surface 118 of setter 102. More specifically, in the exemplary embodiment, at least one layer of semiconductor material 112 is deposited on top surface 118. In an alternative embodiment, a second hopper (not shown) may be used to dispense additional semiconductor material 112 across a portion of top surface 118 and/or across a layer of material previously deposited on setter 102. The portion of setter 102 containing semiconductor material 112 is then moved beneath a doctor blade 110 and into heating/cooling region 116.

In the exemplary embodiment, heating/cooling region 116 includes at least one thermal treatment device 114. Thermal treatment device 114 provides heat energy to heating/cooling region 116 and, thus, induces heat to anything placed within region 116. Any heat source may be used that enables fabrication apparatus 100 to function as described herein. In the exemplary embodiment, heating/cooling region 116 also includes at least one heat extractor 122. Heat extractor 122 removes heat from an object positioned within heating/cooling region 116.

An inert atmosphere is preferably maintained within an interior of fabrication apparatus 100. More specifically, in the exemplary embodiment, the interior of fabrication apparatus 100 is sealed to facilitate preventing the inert materials from escaping from the fabrication apparatus 100 and/or to prevent the influx of contaminants from external to fabrication apparatus 100.

Figure 2:
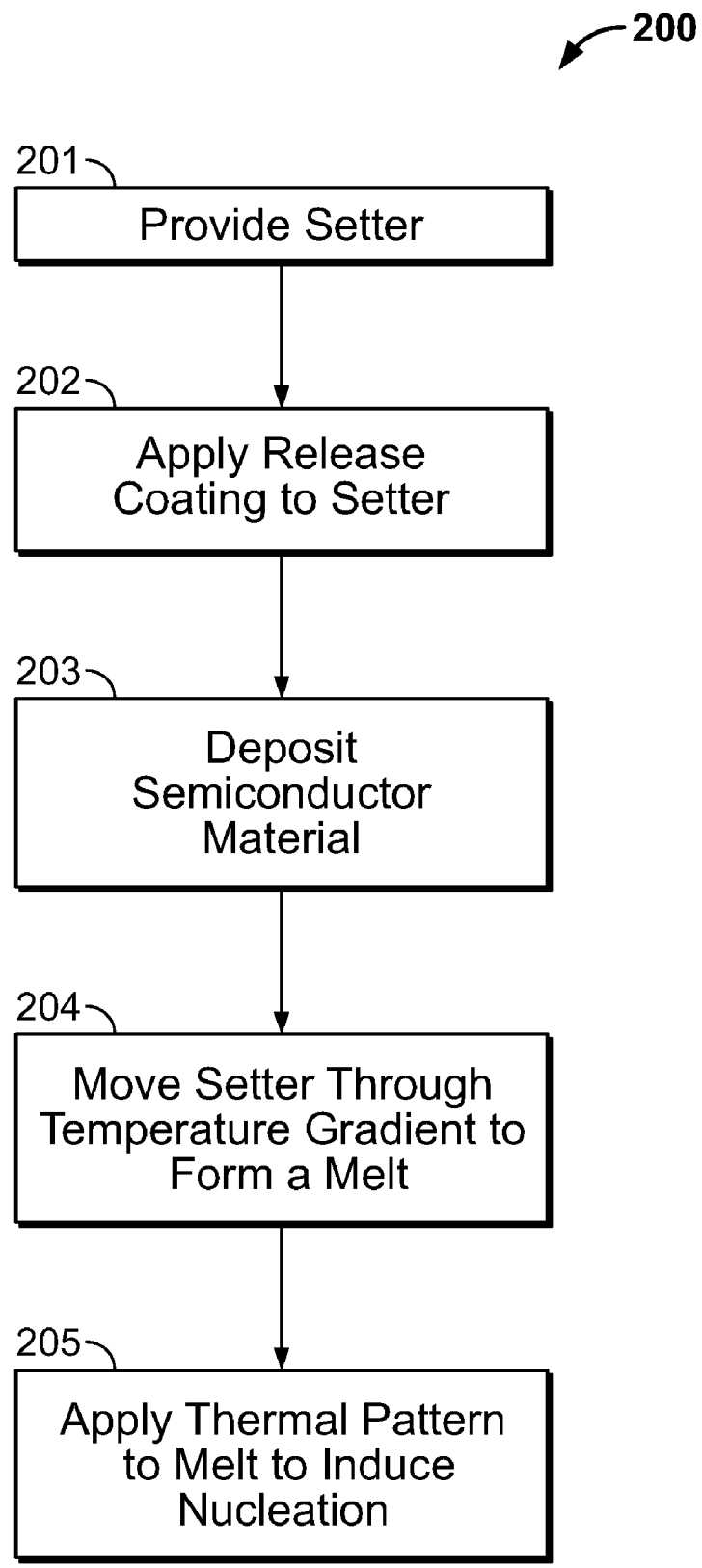
FIG. 2 is a flow chart illustrating an exemplary method of fabricating a semiconductor wafer using the fabrication apparatus shown in FIG. 1.

FIG. 2 is a flow chart illustrating an exemplary method 200 of fabricating a semiconductor wafer 144 using fabrication apparatus 100 (shown in FIG. 1). Referring to both FIGS. 1 and 2, when fabricating a semiconductor wafer 144, a setter 102 is initially selected 201. More specifically, the shape of the setter 102 selected determines the shape of the finished semiconductor wafer 144 produced. Accordingly, setter 102 may provide, for example and without limitation, substantially square wafers, substantially circular wafers, and/or substantially rectangular wafers. Setter 102 may include one or more recesses (not shown) that have a predetermined shape and/or a predetermined topography that imparts a pattern (not shown in FIGS. 1 and 2) on material layers during the fabrication process. For example, the recesses may be organized into a series of peaks and valleys. In the exemplary embodiment, setter 102 includes one or more recesses defined on each of a first surface (not shown) and an opposite second surface (not shown). Providing recesses on both the first and second surfaces allows setter 102 to be moved through a furnace, such as apparatus 100, with either side facing upward and with either side against the setter 102.

A release coating 124 is applied 202 across setter top surface 118 to enable that setter 102 to easily separate from the finished semiconductor wafer 144. In one embodiment, the release coating 124 is silicon nitride ($Si_3N_4$). Alternative embodiments may use silicon dioxide ($SiO_2$) or silicon carbide (SiC) as a release agent. In other alternative embodiments, any other ingredient can be used as a release agent that enables wafers 144 to be produced as described herein. More specifically, in the exemplary embodiment, a liquid slurry containing the release coating 124 is applied to setter 102. The release coating 124 may be applied to setter 102 using known application means including, but not limited to, a painting process and/or a spraying process. In one embodiment, the release coating 124 is applied to setter 102 in a predetermined pattern. In another embodiment, release coating 124 is applied in a predetermined thickness gradient.

At least one semiconductor material 112 is then deposited 203 across the release coating 124. In the exemplary embodiment, semiconductor material 112 is deposited 203 after the release coating 124 has dried. Moreover, in the exemplary embodiment, semiconductor material 112 is deposited in a predetermined amount from a hopper 108, as described above. In one embodiment, semiconductor material 112 is deposited over release coating 124 with a substantially constant thickness. In another embodiment, semiconductor material 112 is deposited over release coating 124 in a predetermined pattern and/or with a predetermined thickness gradient.

In the exemplary embodiment, setter 102, including release coating 124 and semiconductor material 112, is then moved 204 through heating/cooling region 116. Heat sources 114 and heat extractor 122 within heating/region 116 induce a desired thermal profile 140 to material 112 and coating 124. In the exemplary embodiment, thermal profile 140 includes a plurality of regions having varying temperatures and wherein the semiconductor material 112 undergoes physical changes. For example, a preheat region 130 occurs after setter 102, including release coating 124 and semiconductor material 112 is passed under doctor blade 110. A melt region 132 is then introduced to coating 124 and material 112, such that within melt region 132, the temperature exceeds, by a predetermined amount, the melting temperature of semiconductor material 112. As a result, within melt region 132 at least a top surface 128 of semiconductor material 112 forms a melt 126. Setter 102 then enters crystallization region 134, wherein a liquid layer (not shown) and crystallized layer (not shown) coexist. In the exemplary embodiment, the temperature in crystallization region 134 is reduced in a predetermined manner to facilitate crystallization of melt 126. The temperature may be modified by positioning and/or repositioning heat sources 114 and/or heat extractor 122. Thermal profile 142 also includes a cooling region 136, wherein the crystallized semiconductor material 112 is further cooled. Finally, the cooled wafers 144 are unloaded from apparatus 100 in a wafer unload region 138.

While in crystallization region 134, a predetermined thermal pattern is applied 205 to melt 126 to induce nucleation of semiconductor material 112 in a predetermined location or locations. In the exemplary embodiment, nucleation is induced by changing the heat transfer properties of melt 126, such that a local cold spot 142 is formed on a surface 128 of melt 126. Inducing nucleation at a local cold spot 142 facilitates an orderly crystal formation within melt 126. The heat transfer properties may be changed using a variety of methods. In one embodiment, release coating 124 may be applied to setter 102 in a predetermined pattern (not shown in FIGS. 1 and 2). In another embodiment, release coating 124 may be applied to setter 102 in a predetermined thickness gradient. In another embodiment, the thermal pattern is applied 205 using heat extractor 122, as described below.

Figure 3:
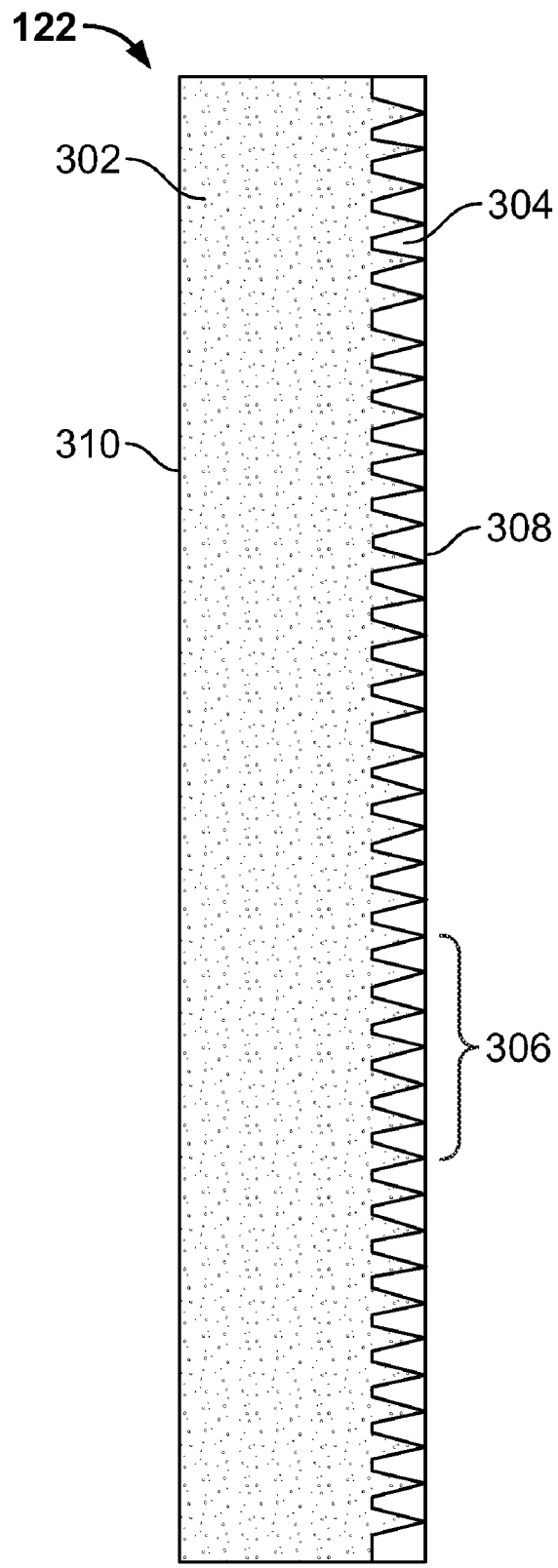
FIG. 3 is an illustration of an exemplary heat extractor that may be used with the apparatus shown in FIG. 1.

FIG. 3 is an illustration of an exemplary heat extractor 122 that may be used with apparatus 100 (shown in FIG. 1). More specifically, in one embodiment, heat extractor 122 includes a pattern 306, a cooled layer 302, and an insulation layer 304. In an alternative embodiment, cooled layer 302 and insulation layer 304 are composed of substantially different materials and are positioned such that there is no contact between layers 302 and 304. In such an embodiment, insulation layer 304 includes a plurality of holes such that insulation layer 304 acts as a patterned mask between cooled layer 302 and melt 126. Moreover, in one embodiment, cooled layer 302 consists substantially of a metal. In an alternative embodiment, cooled layer 302 consists substantially of graphite. In the exemplary embodiment, heat extractor 122 is positioned within apparatus 100 such that a first surface 308 of heat extractor 122 is closer to melt 126 than an opposite second surface 310 of heat extractor 122. In one embodiment heat extractor 122 is positioned in close proximity to melt 126. In such an embodiment, heat extractor 122 is fabricated substantially from a refractory metal and/or a ceramic material. Alternatively, heat extractor 122 may be fabricated from any material that allows heat extractor 122 to function as described herein. Alternatively, in the embodiment described above, in which heat extractor 122 is positioned in contact with melt 126, heat extractor 122 is fabricated from a material or combination of materials that facilitate preventing melt 126 from adhering to heat extractor 122. Further, heat extractor 122 is fabricated from a material or combination of materials that enables heat extractor 122 to withstand the high temperatures used within apparatus 100.

During operation, heat extractor 122 is used in crystallization region 134 to apply a thermal gradient to melt 126 (shown in FIG. 1). In one embodiment, heat extractor 122 is positioned in close proximity to melt 126. More specifically, in such an embodiment, heat extractor 122 is positioned approximately between 0.5 and 15.0 millimeters (mm) and, more specifically, between approximately 1.0 and 10.0 mm from top surface 128 of melt 126. In another embodiment, heat extractor 122 is positioned against melt top surface 128. Heat extractor 122 may include, but is not limited to including, pattern and/or substantially planar surface.

Figure 4:
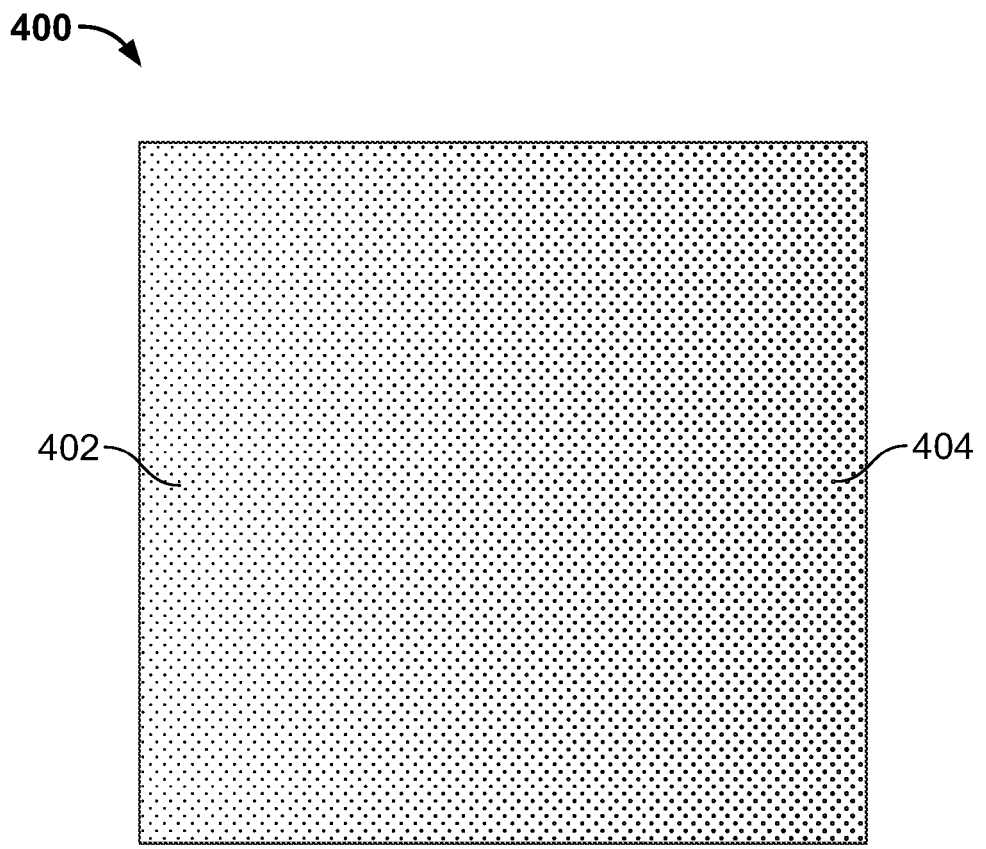
FIG. 4 is a diagram of an exemplary pattern that may be used with the apparatus shown in FIG. 1 using the method shown in FIG. 2.
Figure 5:
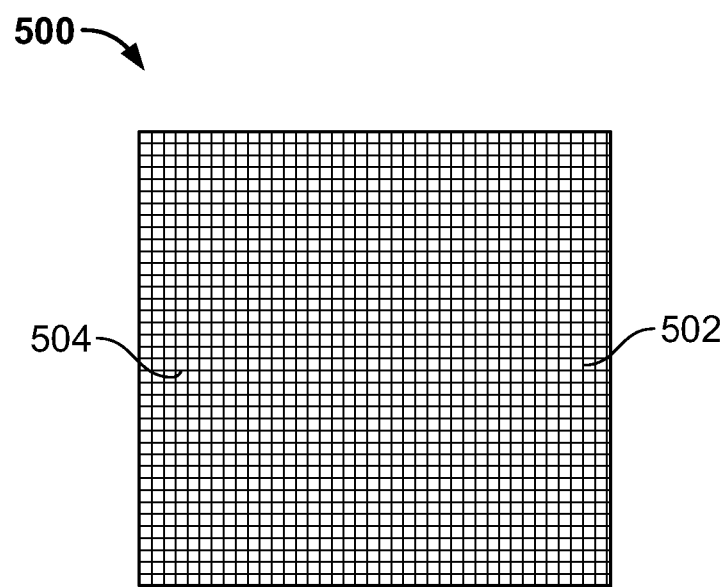
FIG. 5 is a diagram of an alternative pattern that may be used with the apparatus shown in FIG. 1 using the method shown in FIG. 2.

FIG. 4 is a diagram of an exemplary pattern 400 that may be induced to release coating 124, and/or used with setter 102, and/or heat extractor 122 (each shown in FIG. 1). FIG. 5 is a diagram of an alternative pattern 500 that may be applied/used to/with these same elements. More specifically, in an exemplary embodiment and as illustrated in both FIGS. 4 and 5, dark dots and/or lines represent portions 402 and 502 that are raised or elongated with respect to substantially planar and/or recessed portions 404 and 504. In an alternative embodiment, the dark dots and/or lines may represent substantially planar and/or recessed portions 402 and 502 relative to raised or elevated portions 404 and 504. When patterns 400 and 500 are imparted to a surface of melt 126, such as top surface 128, the patterns 400 and 500 facilitate inducing nucleation at raised portions 402 and 502 by reducing the temperature of melt 126 at predetermined portions 402 and 502. Moreover, the portions 402 and 502 facilitate reducing the temperature of melt 126 by modifying the heat exchange properties in such locations. For example, when a heat extractor 122, including pattern 400, is positioned in close proximity to melt 126 such that portions 402 are positioned closer to or against melt 126 than portions 404, heat transfer between melt 126 and portions 402 is faster than heat transfer between melt 128 and portions 404. As heat transfers from melt 126 continues, the temperature at which melt 126 will begin nucleation is reached more quickly at the locations of melt 126 that are closest to portions 402 than at the locations of melt 126 that are closest to portions 404.

During operation, a pattern, such as pattern 400 or pattern 500 (shown in FIGS. 4 and 5, respectively), may be used to apply a thermal gradient to melt 126 (shown in FIG. 1). In the exemplary embodiment, and as described above, applying a thermal gradient facilitates reducing the temperature of melt 126 at predetermined locations 142. Reducing the temperature of melt 126 at predetermined locations 142 facilitates inducing nucleation in a more controlled manner.

The above-described embodiments of methods and apparatus for fabricating a semiconductor wafer facilitate inducing nucleation at predetermined locations of a semiconductor melt. Inducing nucleation at predetermined locations within a semiconductor melt facilitates a more ordered nucleation, thereby increasing the quality of the wafers. Increased wafer quality facilitates increasing performance of the associated component including the wafer, i.e., the associated solar cell, by causing a substantially uniform distribution across the wafer while maintaining low cost. Moreover, inducing nucleation at predetermined locations within a semiconductor melt facilitates growth of larger grains and/or a more columnar grain structure. Such a grain structure facilitates improving the electrical qualities of a semiconductor wafer, thereby increasing the efficiency of the solar cells having such semiconductor wafers.

Exemplary embodiments of methods and apparatus for fabricating a semiconductor wafer are described above in detail. The methods and apparatus are not limited to the specific embodiments described herein, but rather, components of the methods and apparatus may be utilized independently and separately from the other components described herein.

While the invention has been described in terms of various specific embodiments, those skilled in the art will recognize that the invention can be practiced with modification within the spirit and scope of the claims.

What is claimed is:

1. A method for fabricating a semiconductor wafer, said method comprising:
   applying a layer of semiconductor material across a portion of a setter material;
   introducing the setter material and the semiconductor material to a predetermined thermal gradient region to form a melt, the predetermined thermal gradient region including a predetermined nucleation and growth region; and
   inducing crystallization by positioning the melt adjacent a heat extractor in the nucleation and growth region, the heat extractor comprising a surface bearing a pattern wherein at least a first portion of the surface is closer to the melt than a second portion of the surface so that the heat extractor cools a first portion of the melt that is adjacent the first portion of the surface faster than a second portion of the melt that is adjacent the second portion of the surface so as to form at least one local cold spot in the layer of semiconductor material in which crystal nucleation commences before crystal nucleation commences in another location in the layer of semiconductor material.

2. A method in accordance with claim 1 further comprising applying a release coating layer to the setter material such that the release coating is between the setter material and the semiconductor material layer, wherein the release coating is applied with at least one of a predetermined pattern and a thickness gradient.

3. A method in accordance with claim 1 wherein applying a layer of semiconductor material comprises applying the semiconductor material across a release coating applied across the setter material, wherein the setter material is formed with a predetermined pattern.

4. A method in accordance with claim 1 wherein forming the at least one local cold spot comprises contacting the melt with the at least first portion of the heat extractor.

5. A method for fabricating a wafer, said method comprising: providing a setter;
   applying a release coating across a top surface of the setter;
   depositing a semiconductor material across a top surface of the release coating;
   forming a melt by introducing the release coating and the semiconductor material to a predetermined temperature gradient region, the predetermined temperature gradient region including a nucleation and growth region; and
   inducing crystallization by applying a thermal pattern to the melt in the nucleation and growth region to induce nucleation preferentially in at least one desired location in the semiconductor material by positioning the melt adjacent a heat extractor, the heat extractor having a surface bearing a pattern wherein at least a first portion of the surface is closer to the melt than a second portion of the surface so that the heat extractor cools a first portion of the melt that is adjacent the first portion of the surface faster than a second portion of the melt that is adjacent the second portion of the surface so as to form at least one local cold spot in the layer of semiconductor material in which crystal nucleation commences before crystal nucleation commences in another location in the layer of semiconductor material.

6. A method in accordance with claim 5 wherein applying a release coating comprises applying a release coating across a top surface of the setter, wherein the release coating is applied with at least one of a predetermined pattern and a thickness gradient.

7. A method in accordance with claim 5 wherein depositing a semiconductor material comprises depositing the semiconductor material across a top surface of a release coating, wherein the setter includes a predetermined pattern.

8. A method in accordance with claim 5 wherein applying a thermal pattern to the melt comprises placing the surface of the heat extractor in contact with an outer surface of the melt.

9. A method in accordance with claim 1 wherein positioning the melt adjacent the heat extractor comprises advancing the melt past the heat extractor.

10. A method in accordance with claim 5 wherein positioning the melt adjacent the heat extractor comprises advancing the melt past the heat extractor.

11. A method in accordance with claim 1 wherein the surface of the heat extractor is substantially planar and the pattern comprises a plurality of bumps protruding from the substantially planar surface.

12. A method in accordance with claim 1 wherein the surface of the heat extractor is substantially planar and the pattern comprises a plurality of ridges protruding from the substantially planar surface.

13. A method in accordance with claim 5 wherein the surface of the heat extractor is substantially planar and the pattern comprises a plurality of bumps protruding from the substantially planar surface.

14. A method in accordance with claim 5 wherein the surface of the heat extractor is substantially planar and the pattern comprises a plurality of ridges protruding from the substantially planar surface.

* * * * *